(12) United States Patent
Chen et al.

(10) Patent No.: US 11,848,480 B2
(45) Date of Patent: Dec. 19, 2023

(54) ELECTRONIC DEVICE AND METHOD FOR MANUFACTURING THE SAME

(71) Applicant: Advanced Semiconductor Engineering, Inc., Kaohsiung (TW)

(72) Inventors: Jenchun Chen, Kaohsiung (TW); Ya-Wen Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 42 days.

(21) Appl. No.: 17/460,060

(22) Filed: Aug. 27, 2021

(65) Prior Publication Data

US 2023/0060538 A1    Mar. 2, 2023

(51) Int. Cl.
*H01Q 1/22* (2006.01)
*H01L 23/66* (2006.01)
*H01Q 1/38* (2006.01)

(52) U.S. Cl.
CPC .......... *H01Q 1/2283* (2013.01); *H01L 23/66* (2013.01); *H01Q 1/38* (2013.01); *H01L 2223/6677* (2013.01)

(58) Field of Classification Search
CPC .......... H01Q 1/2283; H01Q 1/38; H01Q 1/42; H01Q 1/243; H01L 23/66; H01L 2223/6677; H04M 1/0277
See application file for complete search history.

(56) References Cited

U.S. PATENT DOCUMENTS

| | | | |
|---|---|---|---|
| 2010/0283700 A1* | 11/2010 | Rajanish | H01L 24/48 343/793 |
| 2019/0280386 A1* | 9/2019 | Kowaita | H01Q 1/3275 |
| 2021/0184335 A1* | 6/2021 | Wang | H01L 24/20 |

* cited by examiner

*Primary Examiner* — David E Lotter
(74) *Attorney, Agent, or Firm* — FOLEY & LARDNER LLP

(57) ABSTRACT

An electronic device and a method for manufacturing the same are provided. The electronic device includes a carrier, an antenna element and a cladding element. The carrier defines a first area and a second area adjacent to the first area. The antenna element is in the first area. The cladding element covers the antenna element and is configured for enhancing antenna gain of the antenna element. The second area is exposed from the cladding element and is distant from the antenna element.

16 Claims, 16 Drawing Sheets

ELECTRONIC DEVICE AND METHOD FOR MANUFACTURING THE SAME

BACKGROUND

1. Field of the Disclosure

The present disclosure relates to an electronic device and a method for manufacturing the same, and more particularly to an electronic device including an encapsulant and a method for manufacturing the same.

2. Description of the Related Art

In an electronic device (e.g., an antenna device), a high dielectric constant (Dk) dielectric material is provided to cover an antenna to enhance the performance of the antenna. However, such high Dk dielectric material has a relative high modulus and hardness. During the singulation process, the life of a cutting tool may be reduced. In addition, cracking and/or chipping may occur on the edge of the high Dk dielectric material, which would adversely affect the appearance of the electronic device and the subsequent manufacturing stage. For example, the electronic device may fail to pass the external appearance test. In a worse case, over-plating of a shielding layer may cover the antenna of the electronic device, which may adversely affect the performance of the electronic device.

SUMMARY

In some embodiments, an electronic device includes a carrier, an antenna element and a cladding element. The carrier defines a first area and a second area adjacent to the first area. The antenna element is in the first area. The cladding element covers the antenna element and is configured for enhancing antenna gain of the antenna element. The second area is exposed from the cladding element and is distant from the antenna element.

In some embodiments, an electronic device includes a carrier, an antenna element and a cladding element. The carrier has a first side edge and a first surface extending to the first side edge. The antenna element is adjacent to the first surface of the carrier. The cladding element covers the antenna element and is configured for enhancing antenna gain of the antenna element. At least a portion of the cladding element is distant from the first side edge of the carrier.

In some embodiments, a method for manufacturing an electronic device includes: (a) providing a structure including a plurality of unit carriers, a plurality of antenna elements on the unit carriers and an intermediate portion extending across a boundary between two adjacent unit carriers; and (b) forming an encapsulant to cover the antenna elements, a first part of the intermediate portion and expose a second part of the intermediate portion.

BRIEF DESCRIPTION OF THE DRAWINGS

Aspects of some embodiments of the present disclosure are readily understood from the following detailed description when read with the accompanying figures. It is noted that various structures may not necessarily be drawn to scale, and dimensions of the various structures may be arbitrarily increased or reduced for clarity of discussion.

DETAILED DESCRIPTION

Figure 1:
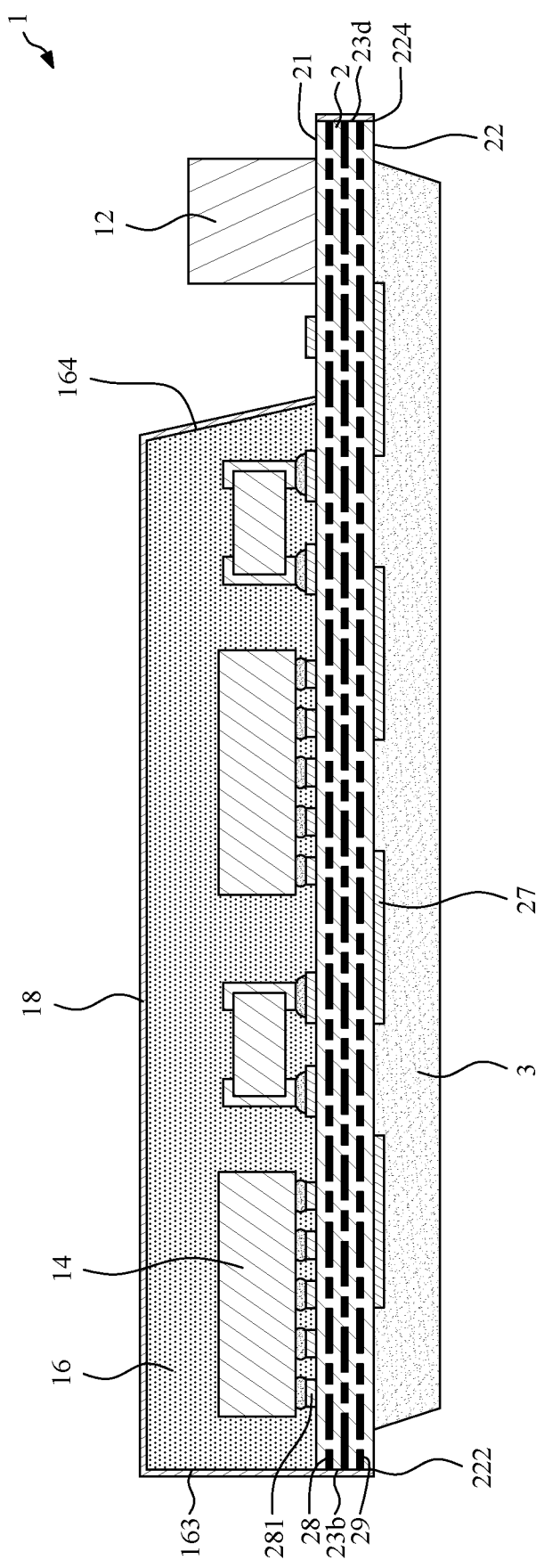
FIG. 1 illustrates a cross-sectional view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
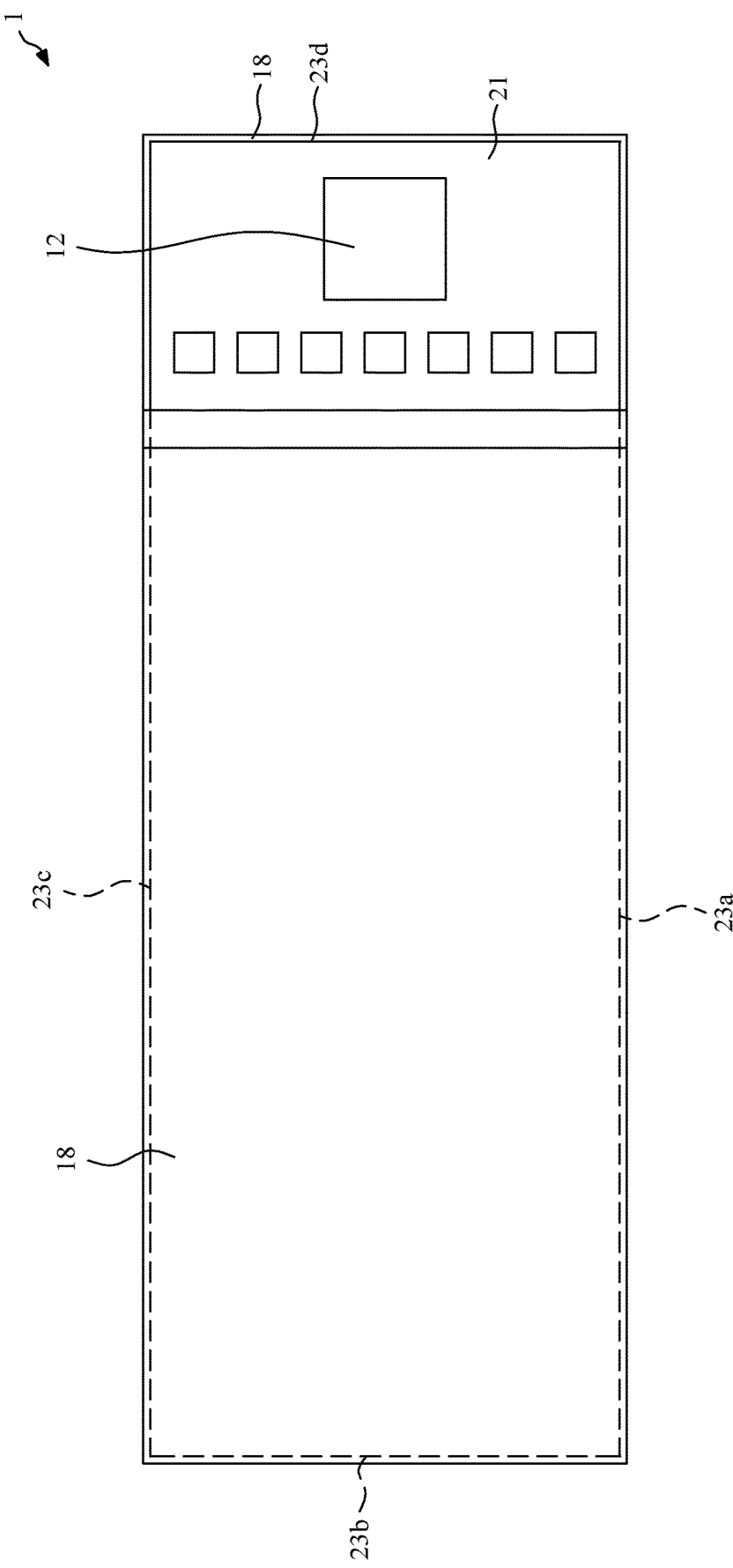
FIG. 2 illustrates a top view of the electronic device of FIG. 1.
Figure 3:
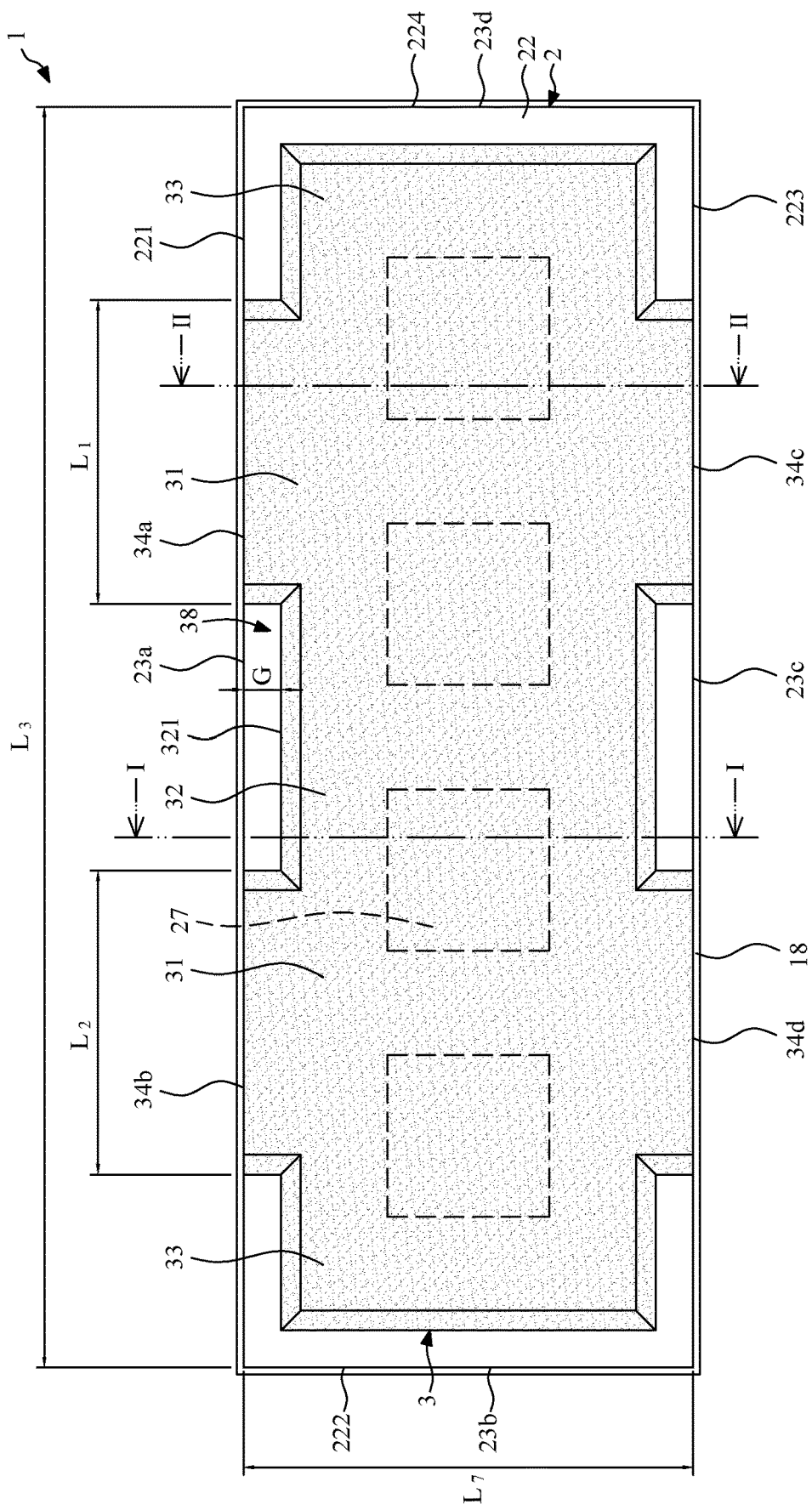
FIG. 3 illustrates a bottom view of the electronic device of FIG. 1.
Figure 4:
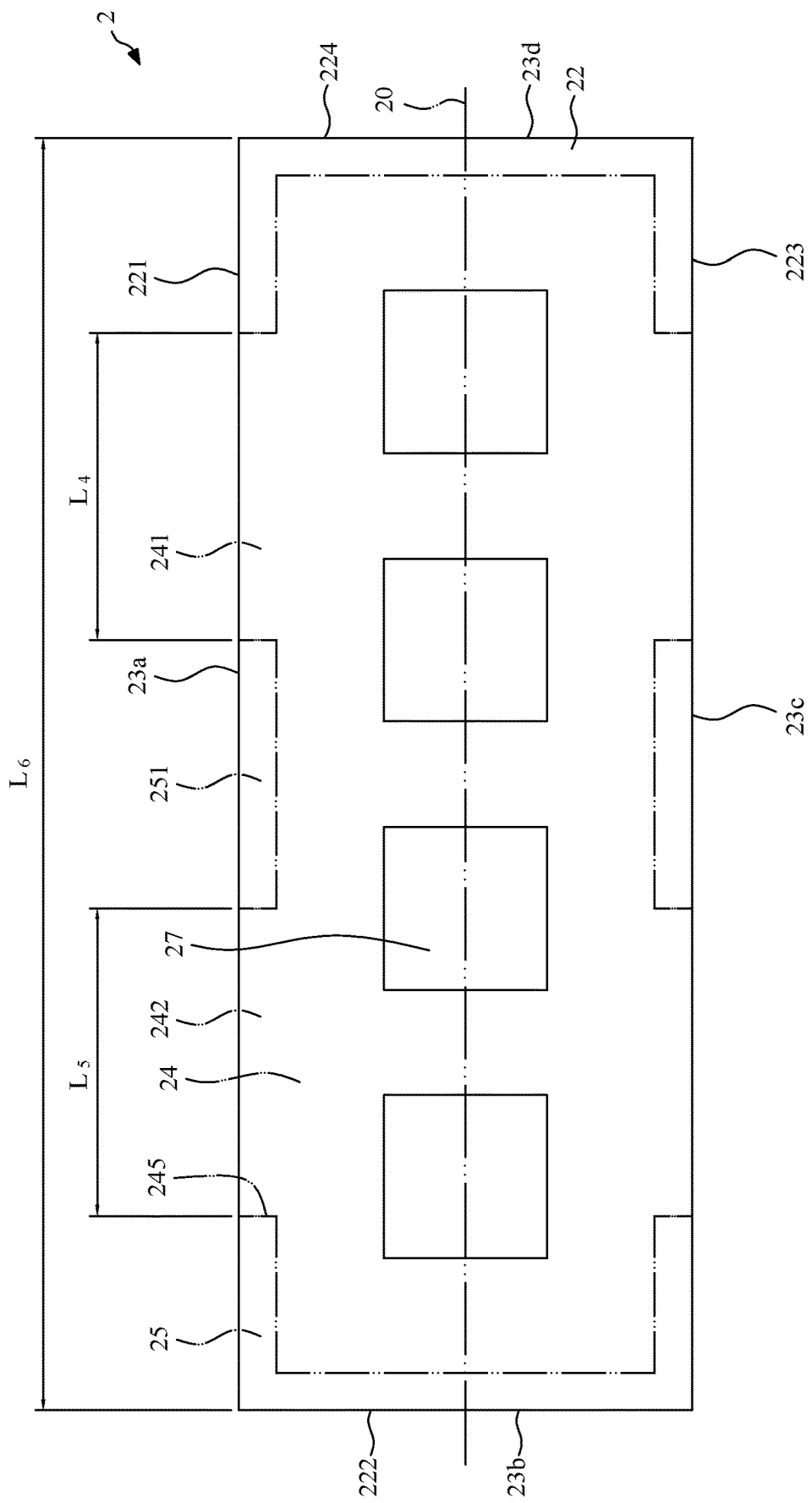
FIG. 4 illustrates a bottom view of a carrier of the electronic device of FIG. 1.
Figure 5:
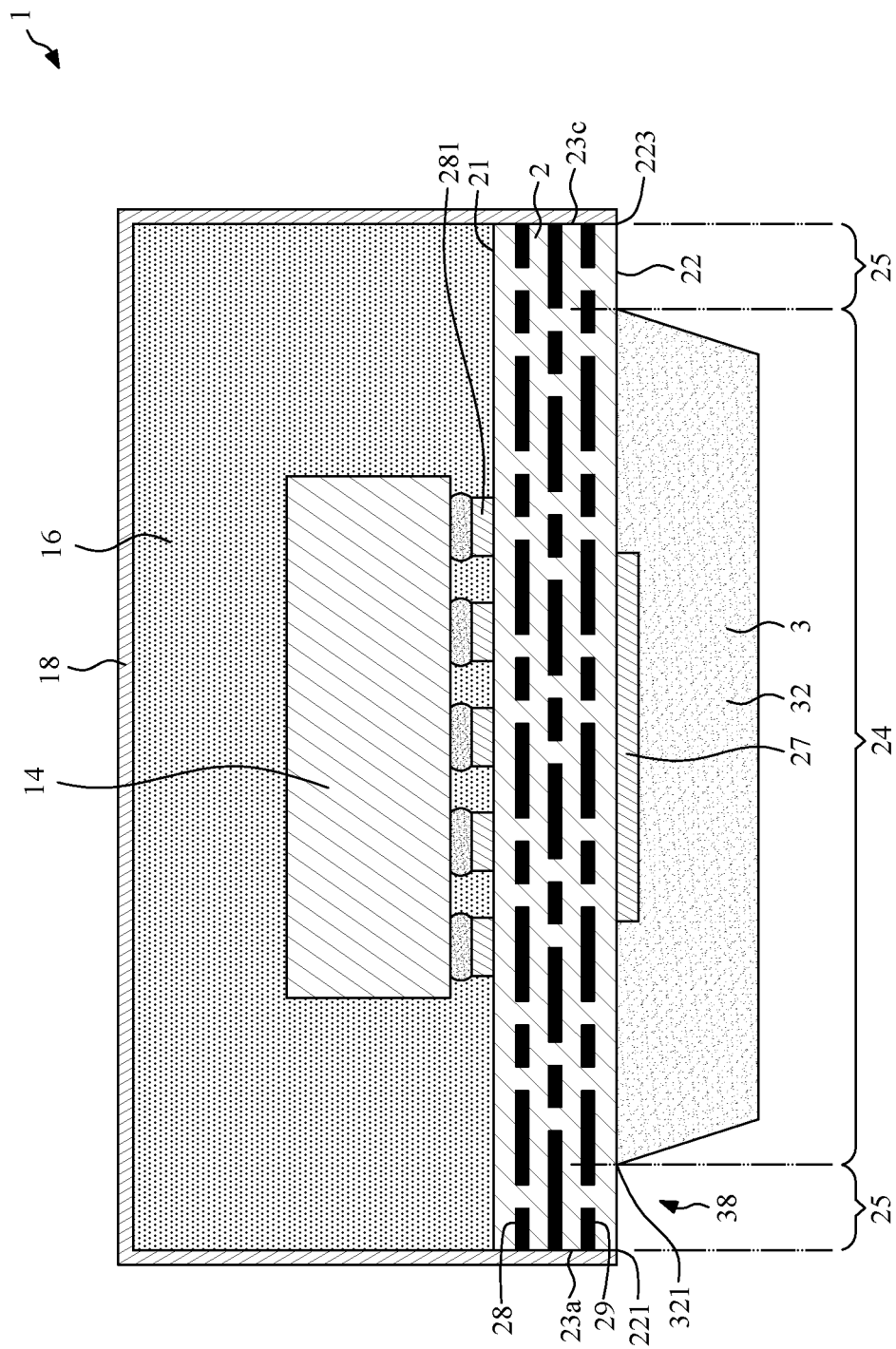
FIG. 5 illustrates a cross-sectional view taken along line I-I in FIG. 3.
Figure 6:
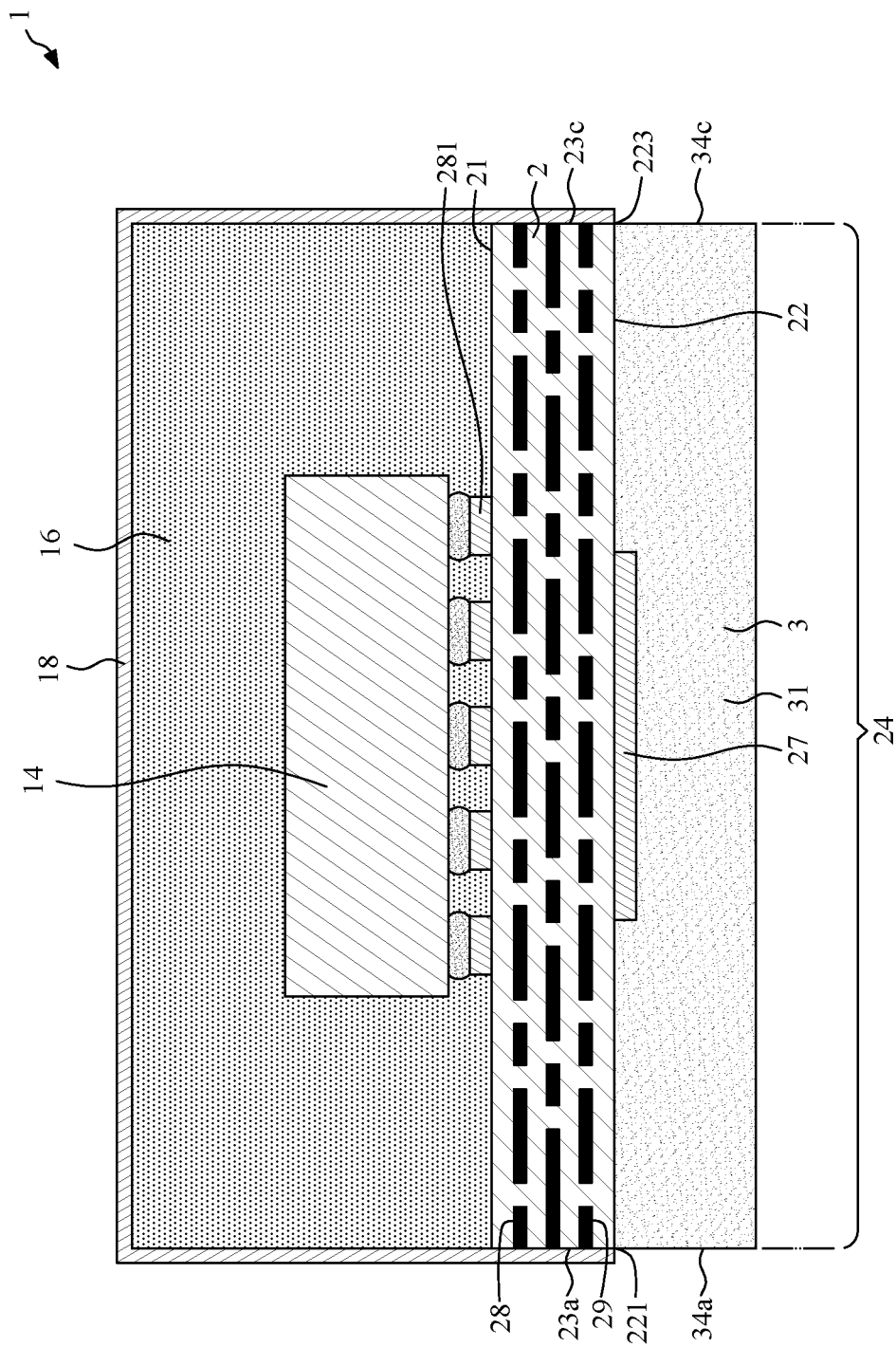
FIG. 6 illustrates a cross-sectional view taken along line II-II in FIG. 3

FIG. 1 illustrates a cross-sectional view of an electronic device 1 according to some embodiments of the present disclosure. FIG. 2 illustrates a top view of the electronic device 1 of FIG. 1. FIG. 3 illustrates a bottom view of the electronic device 1 of FIG. 1. FIG. 4 illustrates a bottom view of a carrier 2 of the electronic device 1 of FIG. 1. FIG. 5 illustrates a cross-sectional view taken along line I-I in FIG. 3. FIG. 6 illustrates a cross-sectional view taken along line II-II in FIG. 3. The electronic device 1 may include a carrier 2, an encapsulant 3, a connector 12, at least one electronic device 14, a package body 16 and a shielding layer 18. In some embodiments, the electronic device 1 may be also referred to as "an antenna device".

The carrier 2 may be a substrate and may have a first surface 21, a second surface 22 opposite to the first surface 21, four lateral surfaces 23a, 23b, 23c, 23d extending between the first surface 21 and the second surface 22 and four side edges 221, 222, 223, 224. The first surface 21 may be also referred to as "a second surface" or "a top surface". The second surface 22 may be also referred to as "a first surface" or "a bottom surface", and may extend to the four side edges 221, 222, 223, 224. As shown in FIG. 2, the lateral surfaces 23a, 23b, 23c, 23d may include a first lateral surface 23a, a second lateral surface 23b, a third lateral surface 23c and a fourth lateral surface 23d. The first lateral surface 23a is opposite to the third lateral surface 23c, and the second lateral surface 23b is opposite to the fourth lateral surface 23d. As shown in FIGS. 1, 3, and 4, the side edges 221, 222, 223, 224 may be disposed on the periphery of the second surface 22, and may include a first long side edge 221 corresponding to the first lateral surface 23a, a first short side edge 222 corresponding to the second lateral surface 23b, a second long side edge 223 corresponding to the third lateral surface 23c, and a second short side edge 224 corresponding to the fourth lateral surface 23d. That is, the first lateral surface 23a may include the first long side edge 221, the second lateral surface 23b may include the first short side edge 222, the third lateral surface 23c may include the second long side edge 223, and the fourth lateral surface 23d may include the second short side edge 224. Thus, the first long side edge 221 is opposite to the second long side edge 223, and the first short side edge 222 is opposite to the second short side edge 224. A length of each of the long side edges 221, 223 is greater than a length of each of the short side edges 222, 224.

The carrier 2 may include a plurality of dielectric layers, a plurality of circuit layers interposed between the dielectric layers, a plurality of bonding pads 281 and one or more antenna elements 27. A material of the dielectric layers of the carrier 2 may include an insulating material, a passivation material, a dielectric material or a solder resist material, such as, for example, a benzocyclobutene (BCB) based polymer, a polyimide (PI) or a polypropylene (PP). In some embodiments, the circuit layers of the carrier 2 may include at least one radio frequency (RF) routing layer 28 and at least one antenna routing layer 29. The RF routing layer 28 may be near to the first surface 21, and the antenna routing layer 29 may be near to the second surface 22. The bonding pads 281 may be disposed adjacent to or disposed on the first surface 21 of the carrier 2, and may be electrically connected to the RF routing layer 28. The antenna elements 27 may be a plurality of antenna patterns or antenna layouts that are disposed adjacent to or disposed on the second surface 22 of the carrier 2. Alternatively, the antenna elements 27 may be disposed within the carrier 2. Alternatively, a portion of each of the antenna elements 27 may be embedded in the carrier 2. In some embodiments, the antenna elements 27 may be electrically connected to or electrically coupled to the antenna routing layer 29. Alternatively, the antenna elements 27 may be a portion of the antenna routing layer 29. The antenna elements 27 may be configured to radiate wireless signals such as radio frequency (RF) signals. Thus, the antenna element 27 may be also referred to as a radiation portion.

Referring to FIGS. 4 and 5, the carrier 2 may define a first area 24 and a second area 25 adjacent to or around the first area 24 on the second surface 22. The second area 25 may extend to the side edges 221, 222, 223, 224 of the carrier 2. A boundary 245 between the first area 24 and the second area 25 may extend to the first long side edge 221 and the second long side edge 223 of the carrier 2. The boundary 245 may be distant from the first short side edge 222 and the second short side edge 224 of the carrier 2. Thus, a portion of the second area 25 may be located between the first area 24 and the short side edges 222, 224 of the carrier 2. In addition, the boundary 245 may be substantially symmetrical with respect to a central plane 20 of the carrier 2. As shown in FIG. 4, the first area 24 may extend from the first long side edge 221 of the carrier 2 to the second long side edge 223 of the carrier 2. For example, the first area 24 may include two extending areas 241, 242 extending to the first long side edge 221, and a portion 251 of the second area 25 may be located between the two extending areas 241, 242. In addition, an area of the first area 24 is greater than an area of the second area 25. As shown in FIG. 4, a length $L_4$ of the extending area 241 is less than a length $L_6$ of the first long side edge 221. For example, the length $L_4$ of the extending areas 241 may be less than about ⅔, or less than about ½, or less than about ⅓ of the length $L_6$ of the first long side edge 221. Further, a length $L_5$ of the extending area 242 may be substantially equal to the length $L_4$ of the extending area 241.

The antenna elements 27 may be disposed on or in the first area 24 of the second surface 22 of the carrier 2. Alternatively, the antenna elements 27 may be disposed adjacent to the first area 24 of the second surface 22 of the carrier 2. The encapsulant 3 may be disposed on the second surface 22 of the carrier 2, and may be disposed on or within the first area 24. The encapsulant 3 may be also referred to as "a cladding element" or "a dielectric resonator". The encapsulant 3 (e.g., the cladding element or the dielectric resonator) may cover the antenna element 27 and may be configured for forming a standing wave based on at least one radio wave introduced into the cladding element 3. For example, the radio wave(s) are introduced into the inside of the cladding element (or the dielectric resonator) 3 from a transmitter circuit (e.g., the radio frequency (RF) routing layer 28 and the antenna routing layer 29 of the carrier 2 and bounce back and forth between the walls of the cladding element (or the dielectric resonator) 3, thereby, forming standing waves. The walls of the cladding element (or the dielectric resonator) 3 are partially transparent to radio waves, allowing the radio power to radiate into space. Further, the cladding element (or the dielectric resonator) 3 may be used to adjust impedance matching, so as to reduce the return loss (S11) and enhance antenna gain of the antenna elements 27. In addition, the second area 25 is exposed from the cladding element 3 and is distant from the antenna element 27. In some embodiments, the second area 25 may be spaced apart from or separated from the antenna element 27.

From a bottom view, a shape of the encapsulant 3 is conformal with the first area 24. That is, a size and a location of the encapsulant 3 is consistent with the first area 24. Thus, the second area 25 is exposed from the encapsulant 3.

Alternatively, the second area 25 is free from being covered by the encapsulant 3. The encapsulant 3 may include a high dielectric constant (Dk)/high dissipation factor (Df) material, and may be a radiation enhanced element. The encapsulant 3 may be configured to cover the antenna elements 27 so as to increase gain width, reduce insertion loss and reduce return loss. For example, the encapsulant 3 (e.g., the cladding element or the dielectric resonator) may have an enhanced gain and bandwidth (wide impedance bandwidth) for 5G applications. The material of the encapsulant 3 may include zirconium oxide ($ZrO_2$), titanium oxide ($TiO_2$) and/or aluminum oxide ($AlO_2$).

The encapsulant 3 may include at least one first portion 31, at least one second portion 32 and at least one third portion 33 formed concurrently and integrally as a monolithic structure. As shown in FIG. 3, the encapsulant 3 (the cladding element) includes two first portions 31, one second portion 32 and two third portions 33. The second portion 32 is between the two first portions 31. The first portions 31 and the second portion 32 are disposed between the two third portions 33. At least a portion (e.g., the first portion 31) of the encapsulant 3 (the cladding element) extends from the first long side edge 221 of the carrier 2. In some embodiments, the first portion 31 of the encapsulant 3 (the cladding element) extends from the first long side edge 221 to the second long side edge 223 of the carrier 2. Further, at least a portion (e.g., the second portion 32) of the encapsulant 3 (the cladding element) is distant from the first long side edge 221 of the carrier 2. Thus, a gap G is between an edge 321 of the second portion 32 of the encapsulant 3 on the carrier 2 and the first long side edge 221 of the carrier 2. There may be a recess 38 (or a notch) defined by the two first portions 31 and the second portion 32 of the encapsulant 3 (the cladding element) and the second surface 22 of the carrier 2.

In some embodiments, the second portion 32 of the encapsulant 3 (the cladding element) is also distant from the second long side edge 223 of the carrier 2. In addition, one of the third portions 33 (i.e., the left third portions 33) is distant from the first long side edge 221, the first short side edge 222 and the second long side edge 223 of the carrier 2. The other one of the third portions 33 (i.e., the right third portions 33) is distant from the first long side edge 221, the second short side edge 224 and the second long side edge 223 of the carrier 2. Thus, the encapsulant 3 (the cladding element) is recessed from the short side edges 222, 224 of the carrier 2. The encapsulant 3 (the cladding element) is distant from the second lateral surface 23b and the fourth lateral surface 23d of the carrier 2.

Figure 7:
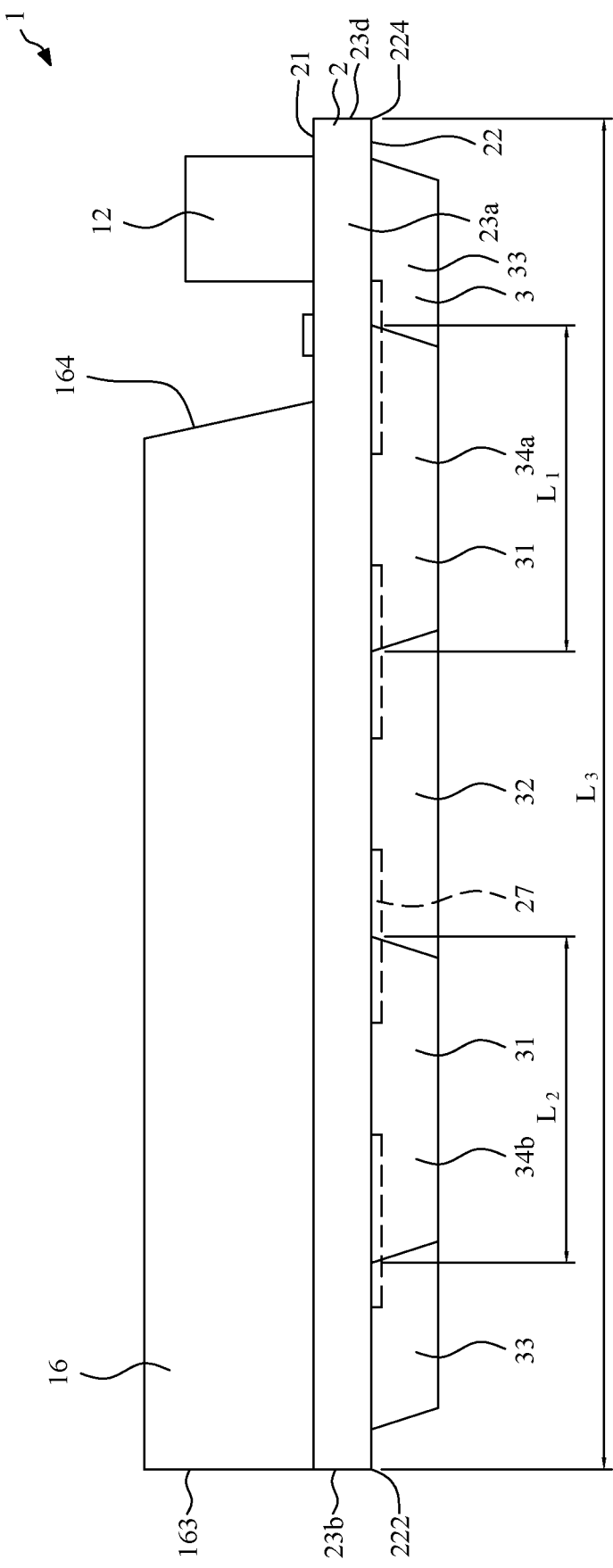
FIG. 7 illustrates a side view of the electronic device of FIG. 1, wherein a shielding layer is omitted.

FIG. 7 illustrates a side view of the electronic device 1 of FIG. 1, wherein a shielding layer 18 is omitted. As shown in FIGS. 3 and 7, the first portions 31 of the encapsulant 3 (the cladding element) have a plurality of lateral surfaces 34a, 34b substantially coplanar or aligned with the first lateral surface 23a of the carrier 2, and the lateral surfaces 34a, 34b of the cladding element 3 (the element) are physically disconnected to or physically separated from each other. A gap is between the lateral surface 34a and the lateral surface 34b. A length $L_1$ of the lateral surface 34a of one of the first portions 31 (i.e., the right first portion 31) of the encapsulant 3 (the cladding element) is less than a length $L_3$ of the first lateral surface 23a of the carrier 2. For example, the length $L_1$ of the lateral surface 34a may be less than about ⅔, or less than about ½, or less than about ⅓ of the length $L_3$ of the first lateral surface 23a of the carrier 2. Further, a length $L_2$ of the lateral surface 34b of the other one of the first portions 31 (i.e., the left first portion 31) of the encapsulant 3 (the cladding element) may be substantially equal to the length $L_1$ of the lateral surface 34a. In addition, the second lateral surface 23b of the carrier 2 may have a length $L_7$. The length $L_3$ of the first lateral surface 23a of the carrier 2 may be greater than the length $L_7$ of the second lateral surface 23b of the carrier 2.

Similarly, as shown in FIG. 3, the first portions 31 of the encapsulant 3 (the cladding element) may also have a plurality of lateral surfaces 34c, 34d substantially coplanar or aligned with the third lateral surface 23c of the carrier 2, and the lateral surfaces 34c, 34d of the cladding element 3 (the cladding element) are physically disconnected to or physically separated from each other. A length of the lateral surface 34c is less than the length $L_3$ of the first lateral surface 23a of the carrier 2. For example, the length of the lateral surface 34c may be less than about ⅔, or less than about ½, or less than about ⅓ of the length $L_3$ of the first lateral surface 23a of the carrier 2. The length of the lateral surface 34c may be substantially equal to the length $L_1$ of the lateral surface 34a. Further, a length of the lateral surface 34d may be substantially equal to the length of the lateral surface 34c.

Referring to FIG. 1, the electronic device 14 (e.g., a semiconductor die or a passive component) may be disposed on and electrically connected to the bonding pads 281 on the first surface 21 of the carrier 2. Thus, the location of the electronic device 14 may be opposite to the location of the antenna elements 27. The electronic device 14 may be disposed on the carrier 2 at a side opposite to the antenna elements 27 and configured to electrically connect the antenna elements 27 through the carrier 2. The package body 16 (e.g., a molding compound with or without fillers) may cover at least a portion of the first surface 21 of the carrier 2 and encapsulate the electronic device 14. Thus, the location of the package body 16 may be opposite to the location of the encapsulant 3. The package body 16 may be distance from, spaced apart from, or apart from the encapsulant 3. A material of the package body 16 may be different from a material of the encapsulant 3. In some embodiments, a modulus, a hardness and a strength of the encapsulant 3 may be greater than a modulus, a hardness and a strength of the package body 16, respectively. The package body 16 may be also referred to as "an encapsulant".

A thickness of the package body 16 may be greater than a thickness of the encapsulant 3. The package body 16 may have a first lateral surface 163 and a second lateral surface 164 opposite to the first lateral surface 163. The first lateral surface 163 of the package body 16 may be substantially coplanar or aligned with the second lateral surface 23b of the carrier 2. The second lateral surface 164 of the package body 16 may be nonparallel with the first lateral surface 163 of the package body 16. In addition, the shielding layer 18 may cover the package body 16, the lateral surfaces 23a, 23b, 23c, 23d of the carrier 2. The shielding layer 18 may be a plated metal layer that is used for EMI (electromagnetic interference) shielding. Thus, the shielding layer 18 may include an electromagnetic interference (EMI) shielding material.

The component 12 may be disposed on a portion of the first surface 21 of the carrier 2 exposed from the package body 16. That is, the component 12 may be disposed on and electrically connected to the portion of the first surface 21 of the carrier 2 that is not covered by the package body 16. Thus, the component 12 and the package body 16 may be disposed on the first surface 21 of the carrier 2 side by side, and there may be a gap between the component 12 and the package body 16. The component 12 may be a connector that is configured to connect the carrier 2 to an external device.

In the embodiment illustrated in FIG. 1 to FIG. 7, before a singulation stage, the first portion(s) 31 of the encapsulant 3 of an unit (corresponding to the electronic device 1) is connected to the first portion(s) of the encapsulant of an adjacent unit in a strip structure, and the second portion 32 of the encapsulant 3 of the electronic device 1 is spaced apart from the second portion of the encapsulant of the adjacent electronic device in the strip structure after a molding process. Then, during the singulation stage, a cutting tool is used cut the strip structure to singulate the carrier 2, the encapsulant 3 and the package body 16. Because the design of the recess 38, only the first portion(s) 31 of the encapsulant 3 may be cut, thus, the amount of the encapsulant 3 to be cut by the cutting tool is reduced. As a result, the life of the cutting tool is improved, and the cracking and/or chipping of the encapsulant 3 is reduced.

In a comparative embodiment, the encapsulant 3 may cover the entire second surface 22 of the carrier 2 completely (i.e., the size of the encapsulant 3 is equal to the size of the entire second surface 22 of the carrier 2 from a bottom view), and may be connected to the encapsulant of an adjacent unit in a strip structure after a molding process. Thus, during a cutting stage or a singulation stage, cracking and/or chipping may occur on an entire edge of the encapsulant 3 since the encapsulant 3 has a relative high modulus and hardness, and large amount of the encapsulant 3 is cut. Further, the life of the cutting tool is very short. In addition, during a plating process of the shielding layer 18, an extending portion of the shielding layer 18 may extend to cover a portion of a bottom surface of the encapsulant 3, which may be designated as bleeding or over-plating. If the extending portion of the shielding layer 18 extend to cover the antenna elements 27, the performance of the electronic device 1 may be adversely affected. To address such concerns, in the embodiment illustrated in FIG. 1 to FIG. 7, the adjacent encapsulants 3 are connected to each other only through the first portion(s) 31. Thus, only the first portion(s) 31 of the encapsulant 3 may be cut during the cutting stage or the singulation stage, and the degree of cracking and/or chipping of the encapsulant 3 is reduced. Therefore, there may be no or even a small amount of the extending portion of the shielding layer 18 that may extend to the encapsulant 3. As a result, the electronic device 1 may pass the external appearance test and the performance of the electronic device 1 is improved.

Figure 8:
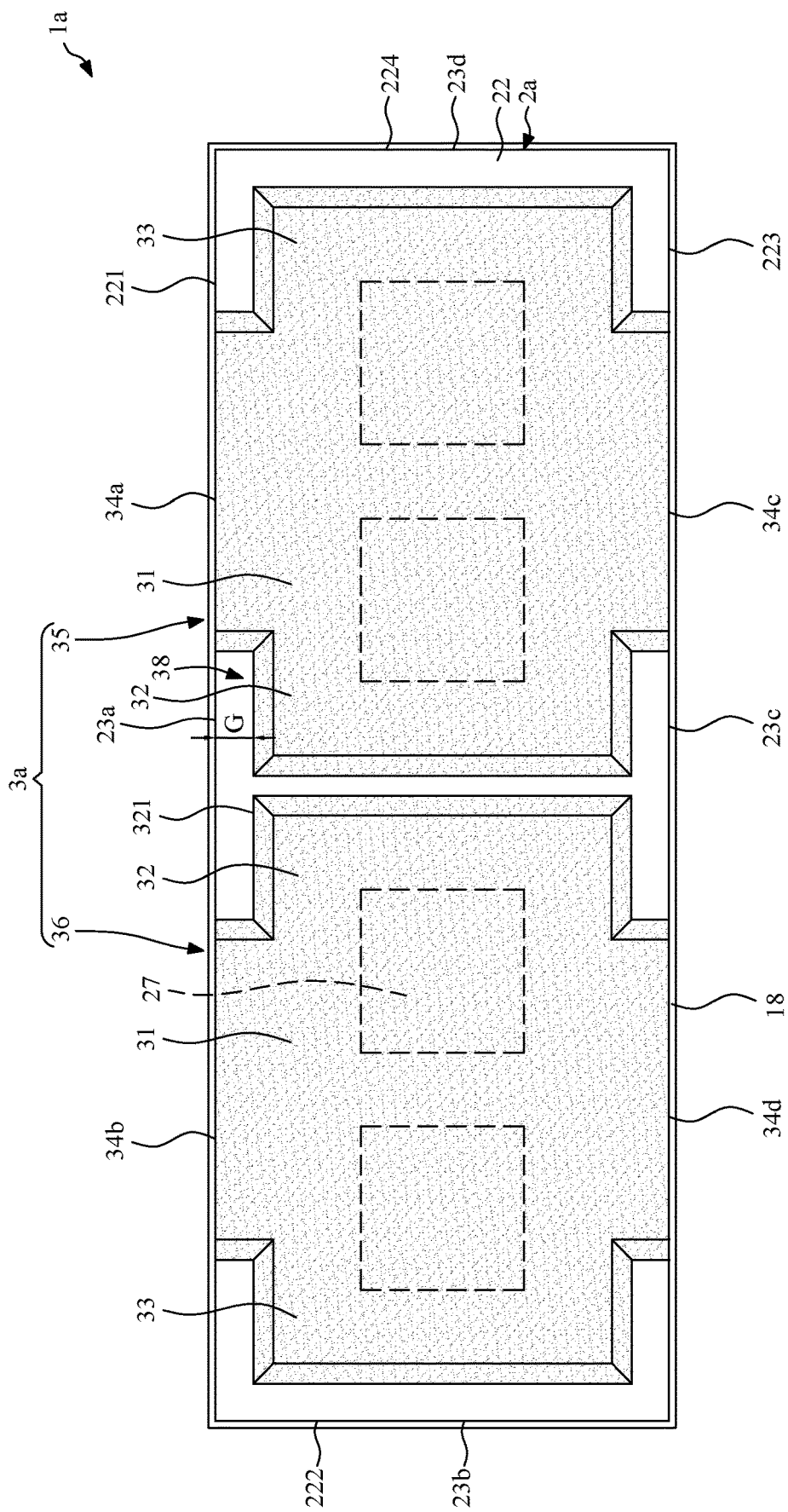
FIG. 8 illustrates a bottom view of an electronic device according to some embodiments of the present disclosure.
Figure 9:
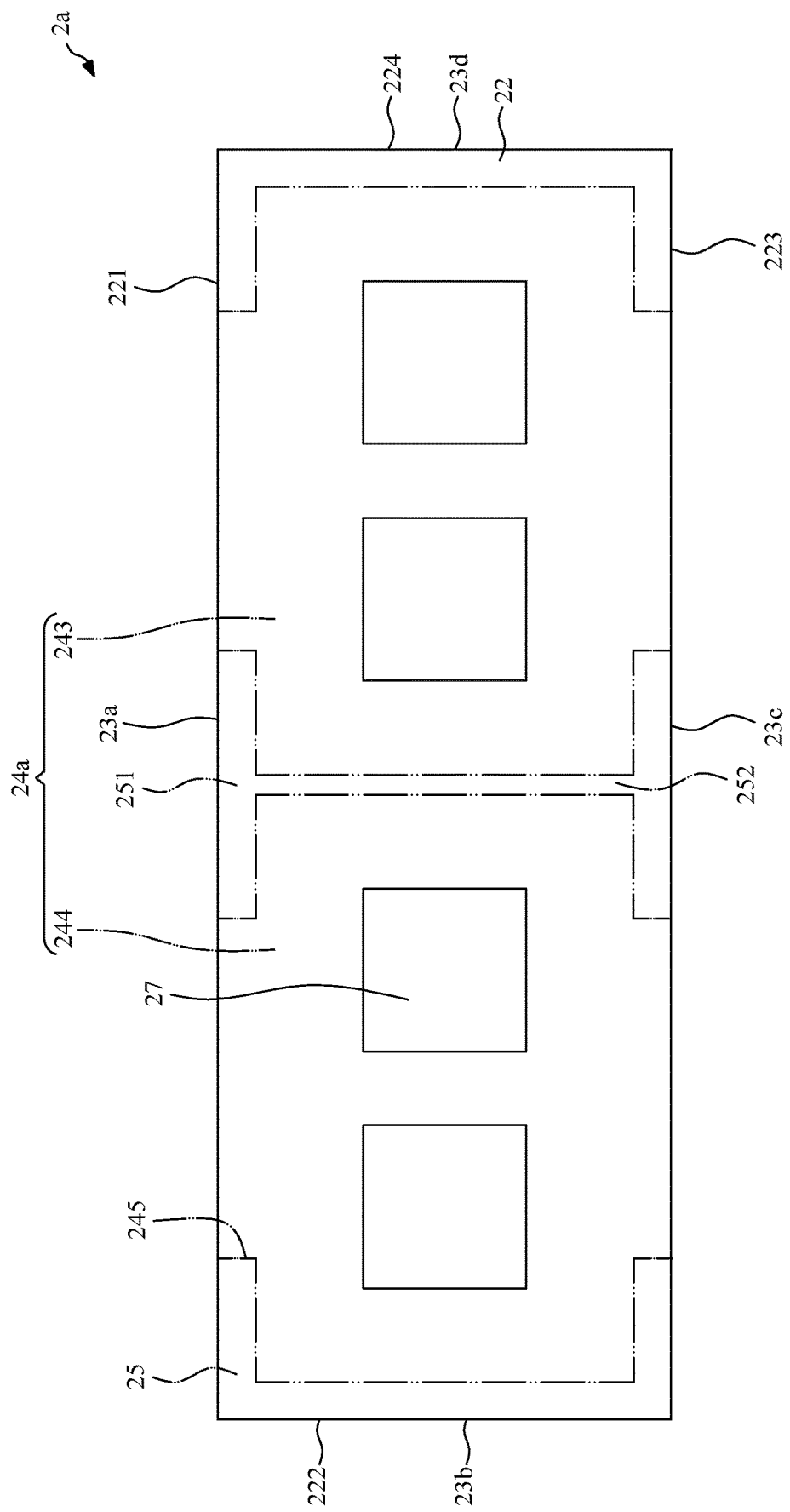
FIG. 9 illustrates a bottom view of a carrier of the electronic device of FIG. 8.

FIG. 8 illustrates a bottom view of an electronic device 1a according to some embodiments of the present disclosure. FIG. 9 illustrates a bottom view of a carrier 2a of the electronic device 1a of FIG. 8. The electronic device 1a of FIGS. 8 and 9 is similar to the electronic device 1 of FIGS. 1 to 7, except for a structure of the carrier 2a and a structure of the encapsulant 3a.

The carrier 2a of FIG. 9 is similar to the carrier 2 of FIG. 4, except that the first area 24a of the carrier 2a of FIG. 9 includes a first portion 243 and a second portion 244 physically disconnected to or physically separated from the first portion 243. A portion 252 of the second area 25 is disposed between the first portion 243 and the second portion 244. That is, the portion 252 of the second area 25 is configured to separate the first portion 243 and the second portion 244. In addition, the encapsulant 3a of FIG. 8 is similar to the encapsulant 3 of FIG. 3, except that the encapsulant 3a of FIG. 8 includes a first section 35 and a second section 36 physically disconnected to or physically separated from the first section 35. The first section 35 and the second section 36 of the encapsulant 3a are disposed on the first portion 243 and the second portion 244 of the first area 24a of the carrier 2a, respectively. Thus, the first section 35 and the second section 36 of the encapsulant 3a are spaced apart from each other. The first section 35 of the encapsulant 3a includes a second portion 32, a third portion 33 and a first portion 31 disposed between the second portion 32 and the third portion 33. The first section 35 of the encapsulant 3a has the lateral surface 34a and the lateral surface 34c. Similarly, the second section 36 of the encapsulant 3a includes a second portion 32, a third portion 33 and a first portion 31 disposed between the second portion 32 and the third portion 33. The second section 36 of the encapsulant 3a has the lateral surface 34b and the lateral surface 34d. In the embodiment illustrated in FIGS. 8 and 9, since the first section 35 and the second section 36 of the encapsulant 3a are separated from each other, the warpage of the electronic device 1a may be reduced.

FIG. 10 through FIG. 16 illustrate a method for manufacturing an electronic device according to some embodiments of the present disclosure. In some embodiments, the method is for manufacturing the electronic device 1 shown in FIG. 1 to FIG. 7.

Figure 10:
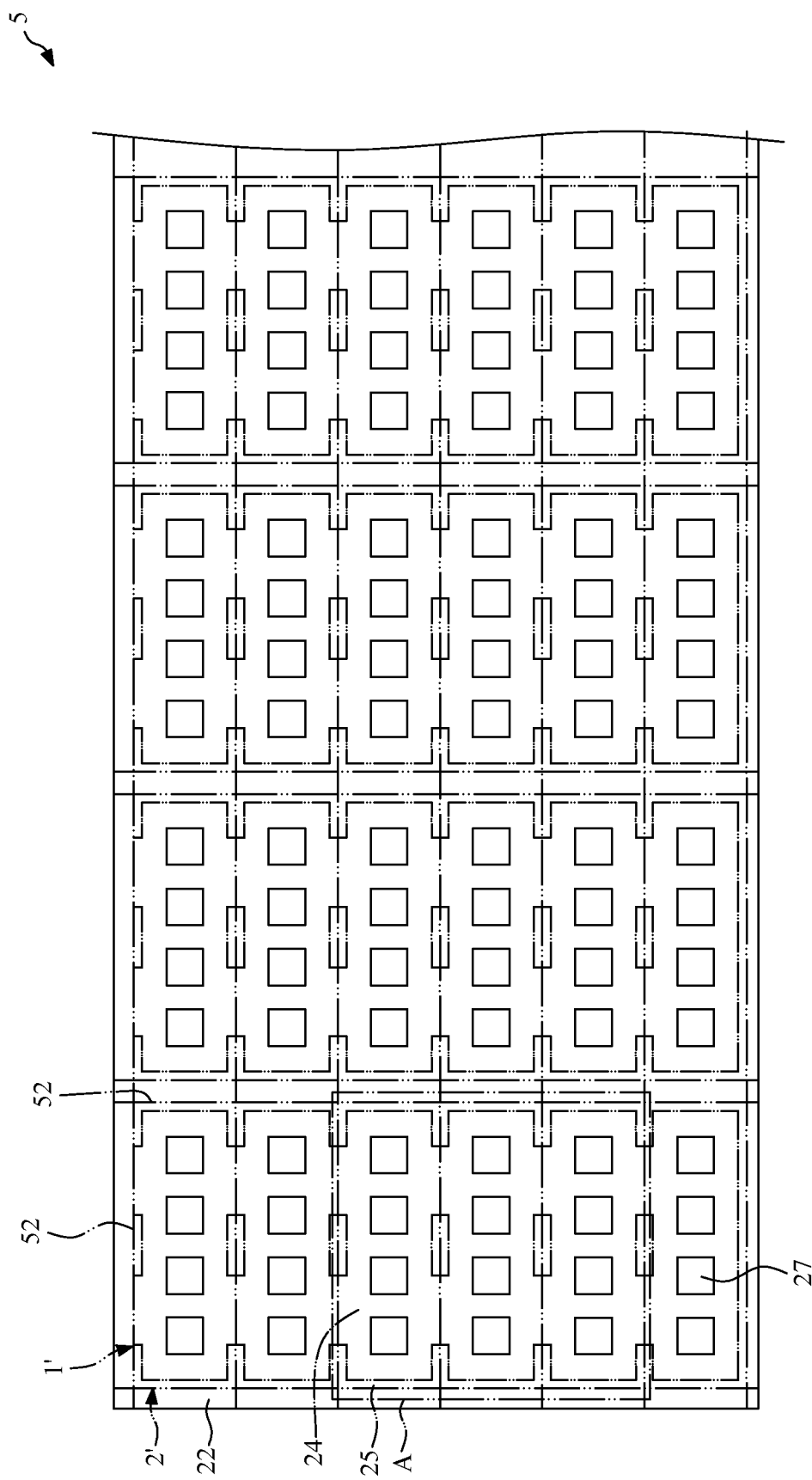
FIG. 10 illustrates one or more stages of an example of a method for manufacturing an electronic device according to some embodiments of the present disclosure.
Figure 11:
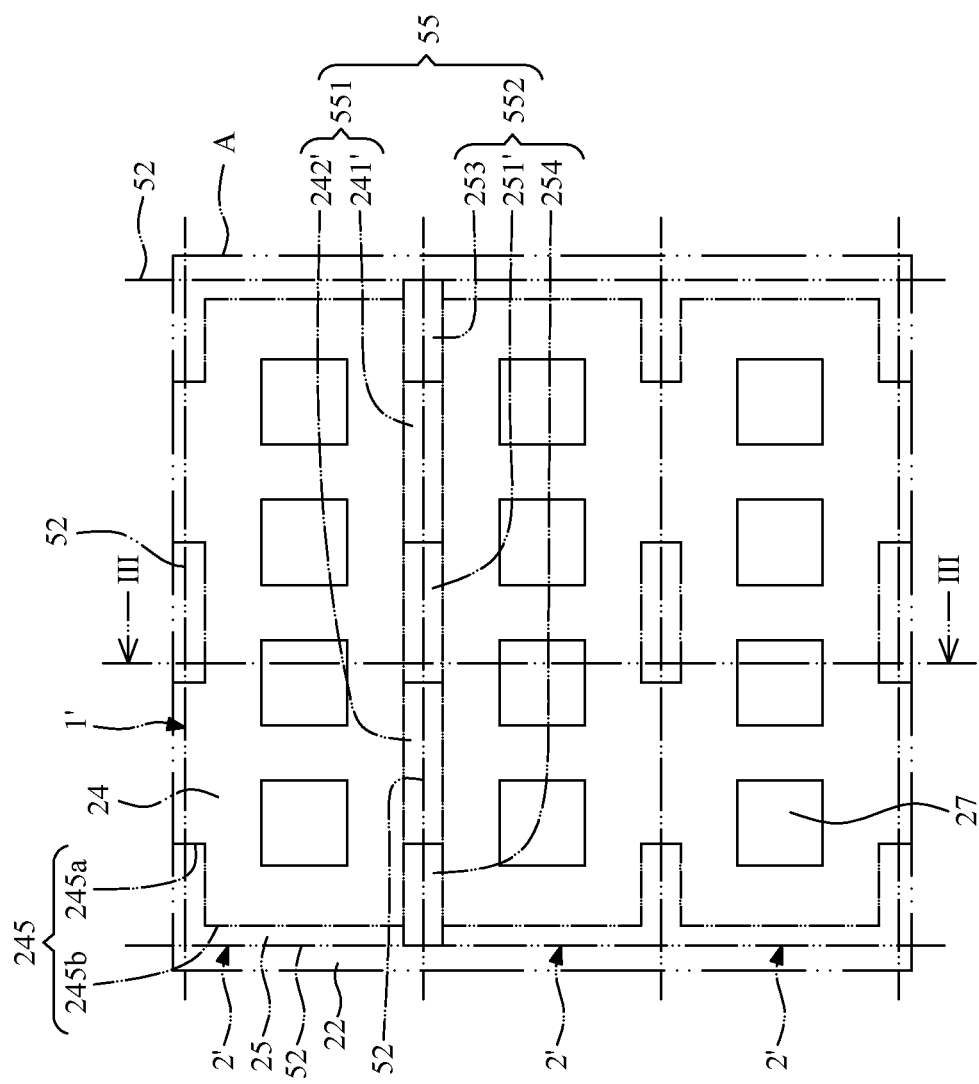
FIG. 11 illustrates one or more stages of an example of a method for manufacturing an electronic device according to some embodiments of the present disclosure.
Figure 12:
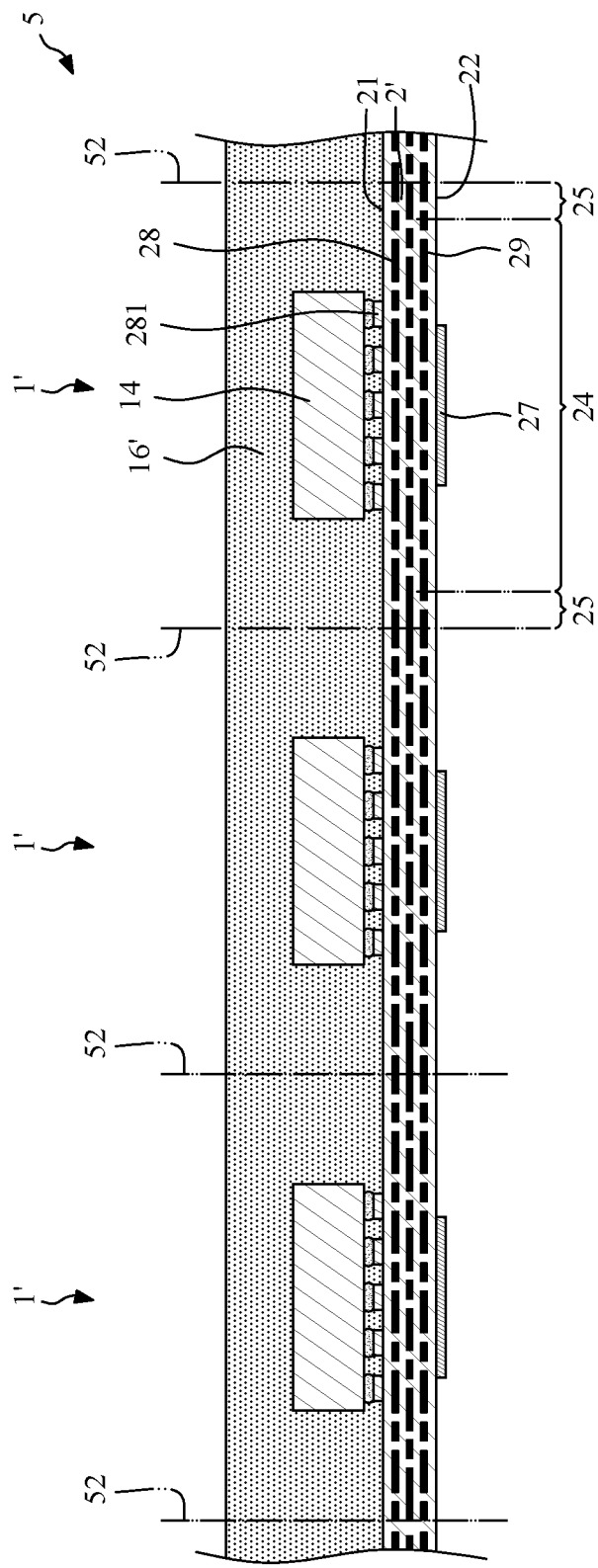
FIG. 12 illustrates one or more stages of an example of a method for manufacturing an electronic device according to some embodiments of the present disclosure.

Referring to FIGS. 10 to 12, a structure 5 is provided, wherein FIG. 10 illustrates a bottom view of the structure 5 according to some embodiments of the present disclosure, FIG. 11 illustrates an enlarged view of a region "A" of FIG. 10, and FIG. 12 illustrates a cross-sectional view taken along line in FIG. 11. The structure 5 may be in a strip type, and may include a plurality of carrier units 2', a package body 16' and at least one electronic device 14. The carrier unit 2', the package body 16' and the electronic device 14 of FIGS. 10 to 12 may be similar to the carrier 2, the package body 16 and the electronic device 14 of FIG. 1 to FIG. 7, respectively. The structure 5 may have a plurality of imaginary cutting lines 52 (or scribe lines). The cutting lines 52 may include a plurality of horizontal cutting lines and a plurality of vertical cutting lines across with each other to define a plurality of units 1'. Each of the units 1' may be similar to the electronic device 1 shown in FIG. 1 to FIG. 7.

The carrier unit 2' may have a first surface 21 and a second surface 22. The carrier unit 2' may include a plurality of dielectric layers, a plurality of circuit layers interposed between the dielectric layers, a plurality of bonding pads 281 and a plurality of antenna elements 27. In some embodiments, the circuit layers of the carrier unit 2' may include at least one radio frequency (RF) routing layer 28 and at least one antenna routing layer 29. The bonding pads 281 may be disposed adjacent to or disposed on the first surface 21 of the carrier unit 2'. The antenna elements 27 may be a plurality of antenna patterns or antenna layout that are disposed adjacent to or disposed on the second surface 22 of the carrier unit 2'.

The carrier unit 2' may define a plurality of first areas 24 and a plurality of second areas 25 adjacent to or around the first areas 24 on the second surface 22. A boundary 245 may be formed between the first area 24 and the second area 25. In some embodiments, a first portion 245a of the boundary 245 may across the horizontal cutting line 52, and a second portion 245b of the boundary 245 may be distant from the vertical cutting line 52. Thus, a portion of the second area 25 may be located between the first area 24 and the vertical cutting line 52. Each of the first areas 24 may include two extending areas 241', 242' across the horizontal cutting line 52 to connect the adjacent first area 24. A first portion 251' of the second area 25 may be located between the two extending areas 241', 242'. Thus, the first portion 251' of the second area 25 may be in rectangular shape. The antenna elements 27 may be disposed on or within the first areas 24.

In some embodiments, the structure 5 may further include at least one intermediate portion 55 extending across a boundary (e.g., the horizontal cutting line 52) between two adjacent unit carriers 2'. The intermediate portion 55 may include a first part 551 and a second part 552. The first part 551 may include the two extending areas 241', 242' of the first area 24. The second part 552 may include the first portion 251' of the second area 25, a second portion 253 of the second area 25, and a third portion 254 of the second portion 253. As shown in FIG. 11, the second portion 253 of the second area 25 may be located between the extending area 241' of the first area 24 and the vertical cutting line 52. The third portion 254 of the second portion 253 may be located between the extending area 242' of the first area 24 and the vertical cutting line 52. In addition, the boundary (e.g., the horizontal cutting line 52) extends through the first part 551 of the intermediate portion 55 and the second part 552 of the intermediate portion 55.

The electronic device 14 (e.g., a semiconductor die or a passive component) may be disposed on and electrically connected to the bonding pads 281 on the first surface 21 of the carrier unit 2'. The package body 16' (e.g., a molding compound with or without fillers) may be disposed adjacent to or disposed on the first surface 21 of the carrier unit 2' to cover at least a portion of the first surface 21 of the carrier unit 2' and encapsulate the electronic device 14.

Figure 13:
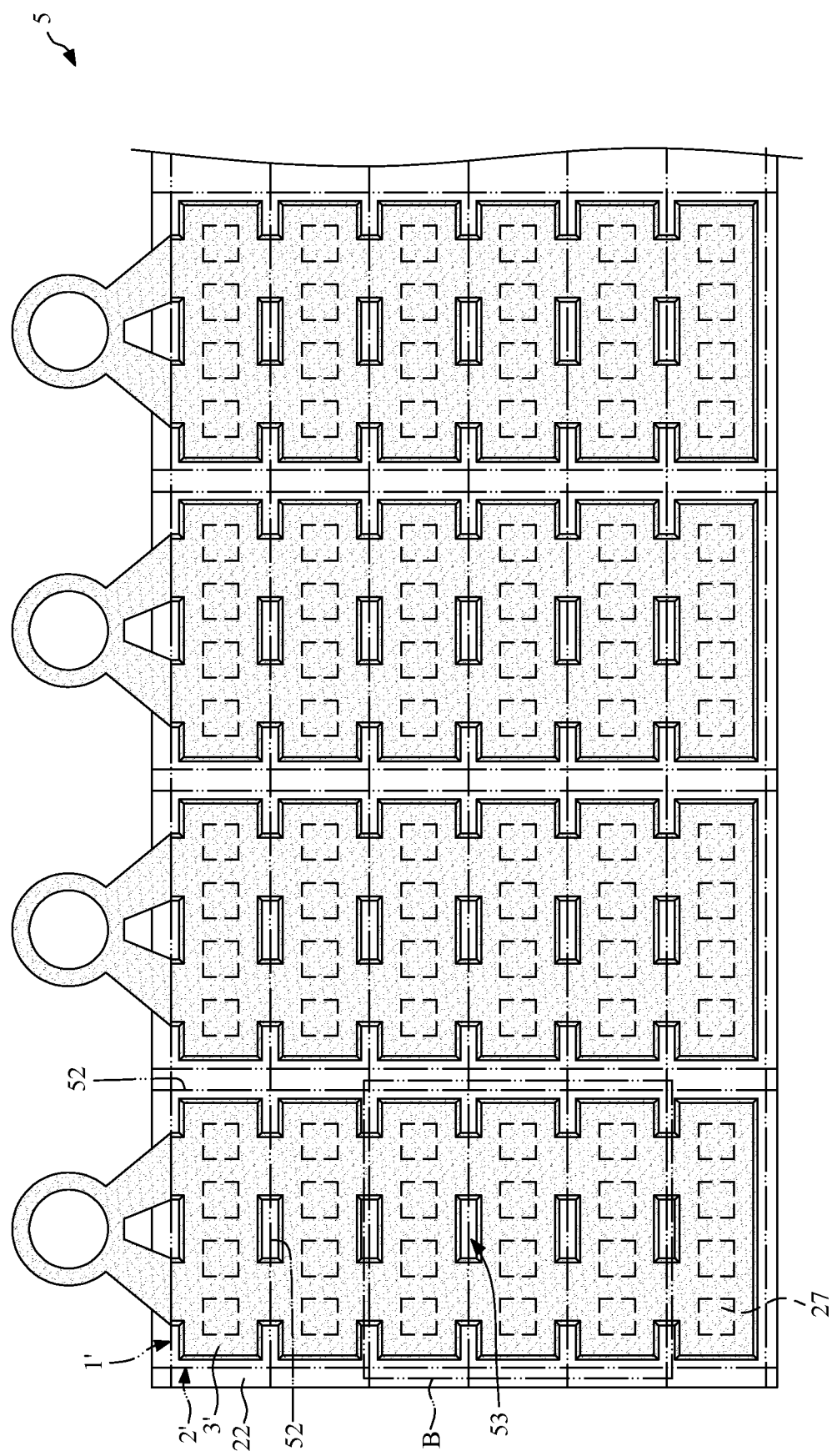
FIG. 13 illustrates one or more stages of an example of a method for manufacturing an electronic device according to some embodiments of the present disclosure.
Figure 14:
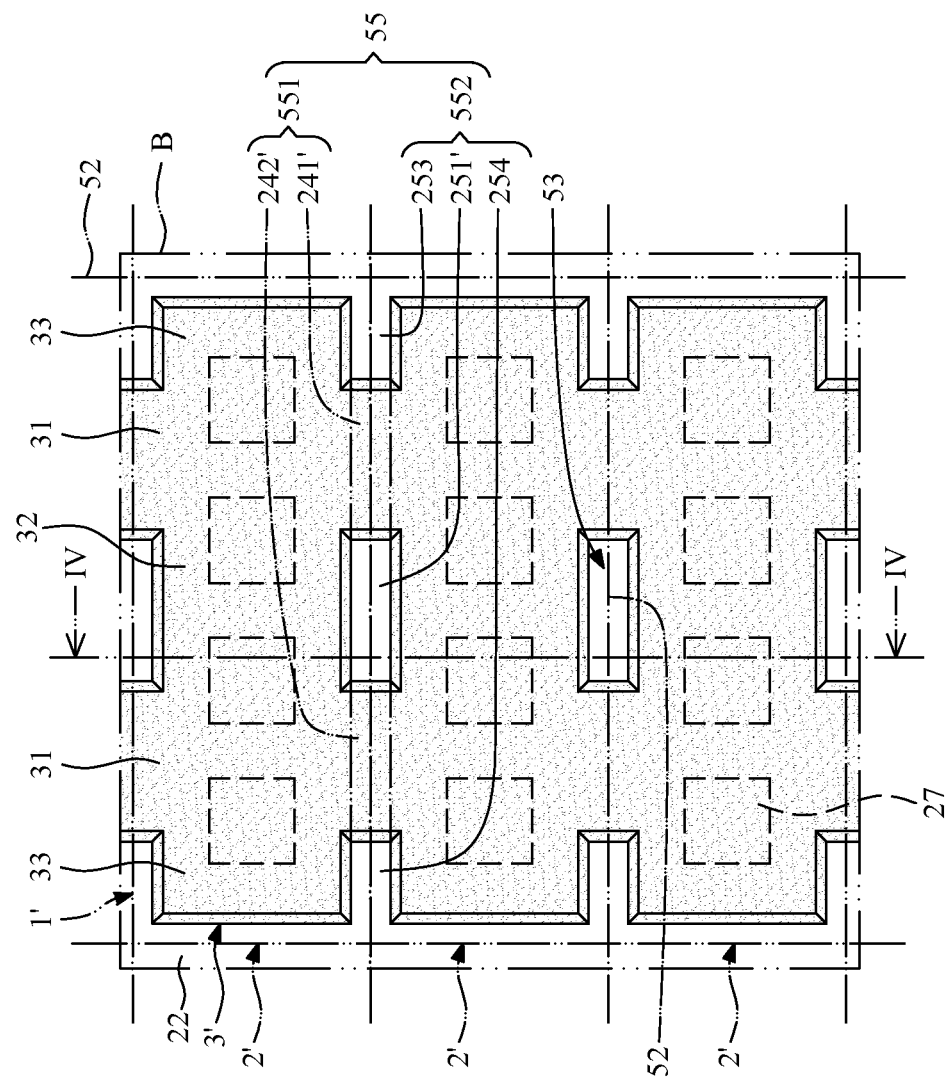
FIG. 14 illustrates one or more stages of an example of a method for manufacturing an electronic device according to some embodiments of the present disclosure.
Figure 15:
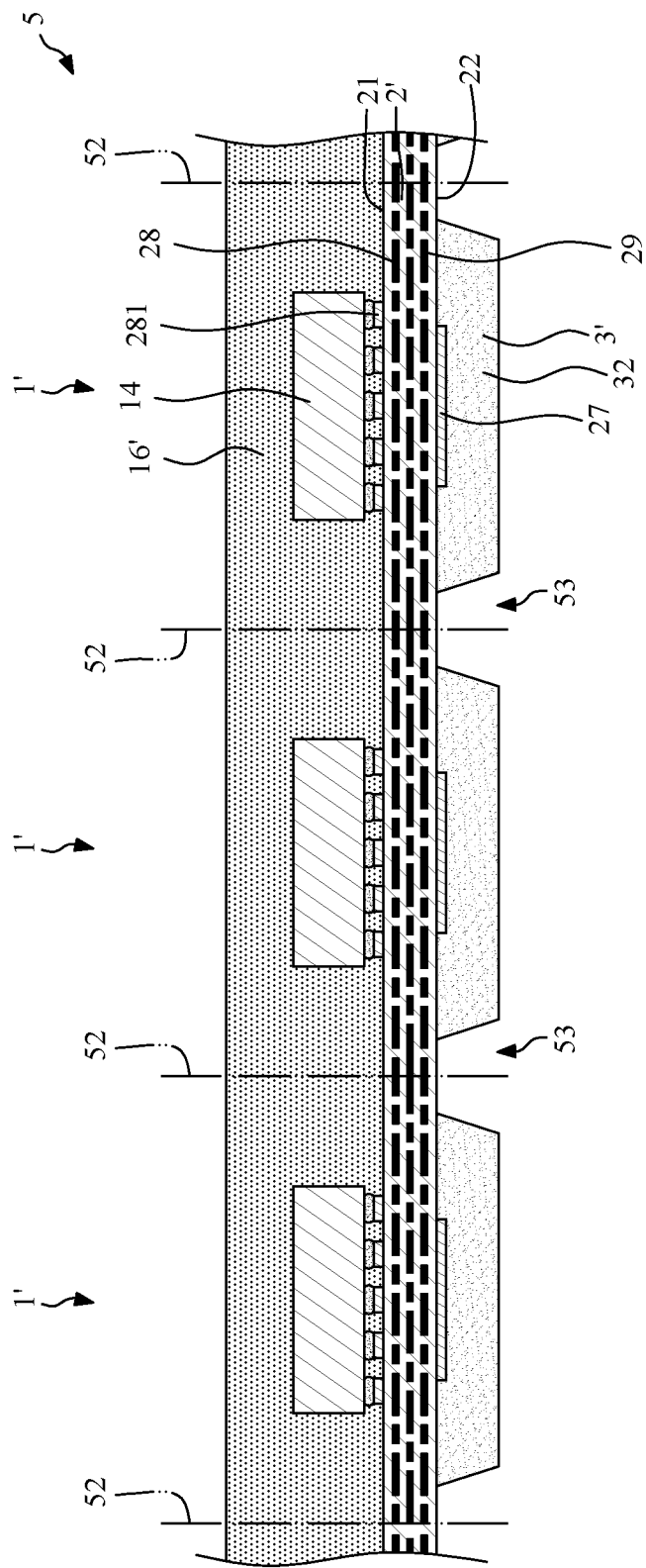
FIG. 15 illustrates one or more stages of an example of a method for manufacturing an electronic device according to some embodiments of the present disclosure.

Referring to FIGS. 13 to 15, an encapsulant 3' may be formed or disposed on the second surface 22 of the carrier unit 2' to cover the antenna elements 27 through a molding tool, wherein FIG. 13 illustrates a bottom view of the structure 5 according to some embodiments of the present disclosure, FIG. 14 illustrates an enlarged view of a region "B" of FIG. 13, and FIG. 15 illustrates a cross-sectional view taken along line IV-IV in FIG. 14.

The encapsulant 3' may be disposed on within the first areas 24. From a bottom view, a shape of the encapsulant 3' is conformal with the first areas 24 of FIG. 10. That is, the size and the location of the encapsulant 3' is consistent with the first areas 24. Thus, the second area 25 is exposed from the encapsulant 3'. Alternatively, the second area 25 is free from being covered by the encapsulant 3'. The encapsulant 3' may cover the first part 551 (including the two extending areas 241', 242' of the first area 24) of the intermediate portion 55 and expose the second part 552 (including the first portion 251', the second portion 253 and the third portion 254 of the second portion 253) of the intermediate portion 55. The encapsulant 3' may be also referred to as a cladding element that includes at least one first portion 31, at least one second portion 32 and at least one third portion 33 formed concurrently and integrally as a monolithic structure. As shown in FIG. 14, the second portion 32 is between two first portions 31. The first portions 31 and the second portion 32 are disposed between two third portions 33. The first portions 31 of the encapsulant 3' (the cladding element) extends across the horizontal cutting line 52. In addition, the encapsulant 3' may define a plurality of openings 53 corresponding to the first portion 251' of the second area 25 of FIG. 11. The openings 53 may be on the horizontal cutting lines 52 to expose portions of the second surface 22 of the carrier unit 2'. That is, the horizontal cutting lines 52 extend through the openings 53 and portions of the first portions 31 of the encapsulant 3' (the cladding element). The first portion 31 of the encapsulant 3' (the cladding element) in one unit 1' extends to or connects the first portion 31 of the encapsulant 3' (the cladding element) in adjacent unit 1'. Further, the second portions 32 of the encapsulant 3' (the cladding element) are distant from the horizontal cutting lines 52. The openings 53 may be defined by two first portions 31 and two second portions 32. In addition, the third portions 33 of the encapsulant 3' (the cladding element) are distant from the vertical cutting lines 52. Thus, the encapsulant 3' (the cladding element) is recessed from the vertical cutting lines 52.

As shown in FIGS. 13 to 15, each of the units 1' may be similar to the electronic device 1 shown in FIG. 1 to FIG. 7.

Figure 16:
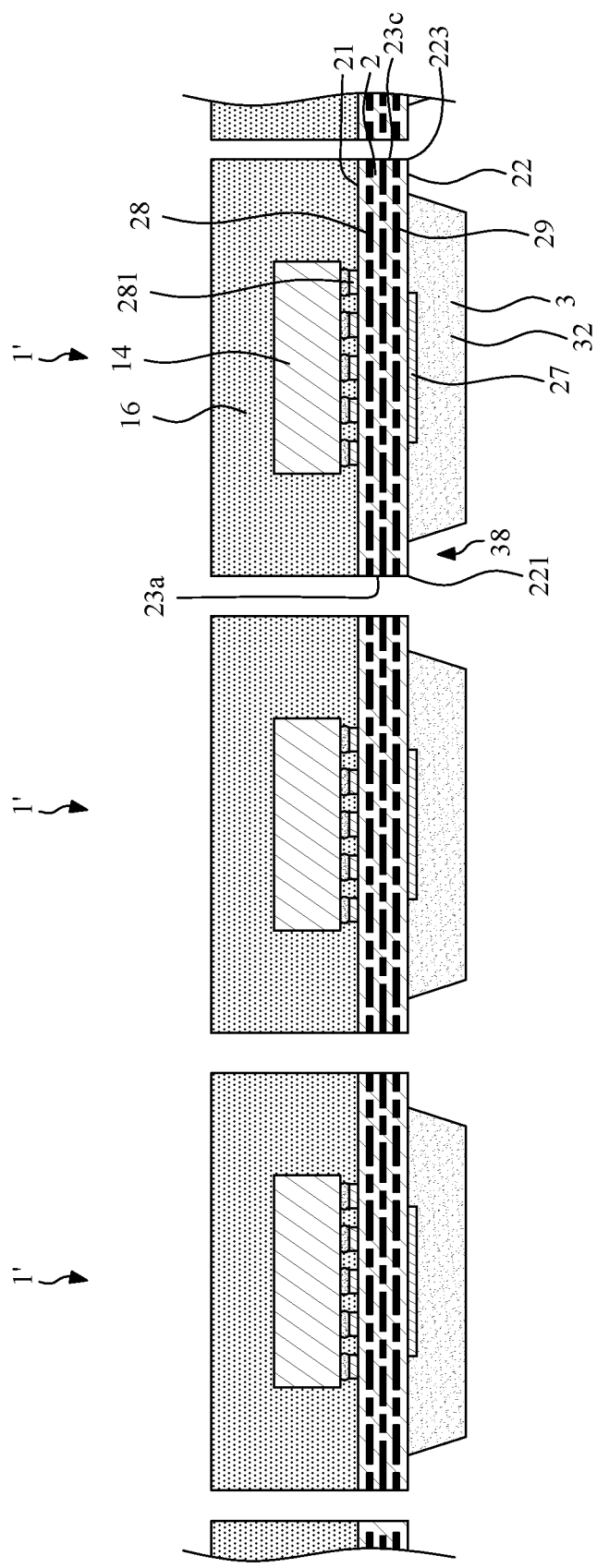
FIG. 16 illustrates one or more stages of an example of a method for manufacturing an electronic device according to some embodiments of the present disclosure.

Referring to FIG. 16, the structure 5 (including the carrier units 2', the package body 16' and the encapsulant 3') is singulated or cut through along the cutting lines 52 so as to obtain a plurality of separated units 1'. Since the encapsulant 3' define the openings 53 on the horizontal cutting lines 52, the amount of the encapsulant 3' to be cut by the cutting tool along the horizontal cutting lines 52 is reduced. Further, the third portions 33 of the encapsulant 3' are distant from the vertical cutting lines 52, thus, there may be no encapsulant 3' to be cut by the cutting tool along the vertical cutting lines 52. As a result, the life of the cutting tool is improved. In addition, the degree of cracking and/or chipping of the encapsulant 3' is reduced. Meanwhile, the carrier unit 2', the package body 16' and the encapsulant 3' in one unit 1' become the carrier 2, the package body 16 and the encapsulant 3. In the unit 1', there may be a recess 38 (or a notch) defined by the first portions 31 and the second portion 32 of the encapsulant 3 and the second surface 22 of the carrier 2.

Then, a shielding layer 18 (e.g., an electromagnetic interference (EMI) shielding material) may be formed to cover the units 1' by, for example, electroplating or sputtering. In some embodiments, the shielding layer 18 may cover the package body 16, the lateral surfaces 23a, 23b, 23c, 23d of the carrier 2. Since the cracking and/or chipping of the encapsulant 3 is reduced, the risk that the shielding layer 18 climbs over the encapsulant 3 is reduced.

Then, a connector 12 may be disposed on a portion of the first surface 21 of the carrier 2 exposed from the package body 16 and the shielding layer 18 by, for example, surface mounting technology (SMT), so as to obtain an electronic device 1 shown in FIG. 1 to FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device comprising:
   a carrier defining a first area and a second area adjacent to the first area;
   an antenna element in the first area;
   a cladding element covering the antenna element and configured for enhancing antenna gain of the antenna element, wherein the second area is exposed from the cladding element and is distant from the antenna element; and
   a package body disposed on the carrier opposite to the cladding element, and a hardness of the cladding element is greater than a hardness of the package body.

2. The electronic device of claim 1, wherein the carrier has a side edge, and a boundary between the first area and the second area extends to the side edge of the carrier.

3. The electronic device of claim 2, wherein the carrier has a long side edge and a short side edge, and the boundary extends to the long side edge of the carrier.

4. The electronic device of claim 3, wherein the boundary is substantially symmetrical with respect to a central plane of the carrier.

5. The electronic device of claim 1, wherein the first area extends from a first long side edge of the carrier to a second long side edge of the carrier.

6. The electronic device of claim 5, wherein the first area includes a first portion and a second portion physically separated from the first portion.

7. The electronic device of claim 1, wherein the cladding element is recessed from a short side edge of the carrier.

8. The electronic device of claim 1, wherein the cladding element has a lateral surface substantially aligned with a lateral surface of the carrier, and a length of the lateral surface of the cladding element is less than a length of the lateral surface of the carrier.

9. An electronic device comprising:
   a carrier having a first side edge and a first surface extending to the first side edge, wherein the carrier further has a first lateral surface and a second lateral surface, a length of the first lateral surface of the carrier is greater than a length of the second lateral surface of the carrier, and the first lateral surface includes the first side edge;
   an antenna element adjacent to the first surface of the carrier; and
   a cladding element covering the antenna element and configured for enhancing antenna gain of the antenna element, wherein at least a portion of the cladding element is distant from the first side edge of the carrier, wherein the cladding element includes a first portion extending to the first side edge of the carrier and a second portion distant from the first side edge of the carrier, wherein the carrier further has a second side edge opposite to the first side edge, and the first portion of the cladding element extends to the second side edge of the carrier.

10. The electronic device of claim 9, wherein the cladding element is distant from the second lateral surface of the carrier.

11. An electronic device comprising:
a carrier having a first side edge and a first surface extending to the first side edge, wherein the carrier further has a second surface opposite to the first surface;
an antenna element adjacent to the first surface of the carrier;
a cladding element covering the antenna element and configured for enhancing antenna gain of the antenna element, wherein at least a portion of the cladding element is distant from the first side edge of the carrier;
an electronic component disposed on the second surface of the carrier and electrically connected to the antenna element through the carrier; and
a package body covering at least a portion of the second surface of the carrier and encapsulating the electronic component.

12. The electronic device of claim 11, wherein the carrier further has a lateral surface extending between the first surface and the second surface, the package body has a first lateral surface substantially aligned with the lateral surface of the carrier and a second lateral surface opposite to and nonparallel with the first lateral surface of the package body, the second lateral surface exposes a component disposed on the carrier, and the component is configured to connect the carrier to an external device.

13. The electronic device of claim 11, wherein a hardness of the cladding element is greater than a hardness of the package body.

14. The electronic device of claim 11, further comprising a shielding layer covering the package body.

15. The electronic device of claim 1, wherein the second area is disposed around the first area.

16. The electronic device of claim 1, wherein a thickness of the package body is greater than a thickness of the cladding element.

* * * * *